United States Patent [19]

Koyama

[11] Patent Number: 5,124,767

[45] Date of Patent: Jun. 23, 1992

[54] DYNAMIC RANDOM ACCESS MEMORY CELL WITH IMPROVED STACKED CAPACITOR

[75] Inventor: Kuniaki Koyama, Tokyo, Japan

[73] Assignee: NEC Corporation, Tokyo, Japan

[21] Appl. No.: 527,974

[22] Filed: May 24, 1990

[30] Foreign Application Priority Data

May 25, 1989 [JP] Japan .................... 1-132105

[51] Int. Cl.$^5$ ............................ H01L 29/68
[52] U.S. Cl. .................... 357/23.6; 357/51
[58] Field of Search ............. 357/23.9, 23.6, 35, 357/71, 67, 68, 41, 59

[56] References Cited

U.S. PATENT DOCUMENTS

| | | | |
|---|---|---|---|
| 2,885,571 | 12/1954 | Williams et al. | 357/68 |
| 3,030,704 | 8/1957 | Hall | 357/67 |
| 3,065,391 | 1/1961 | Hall | 357/68 |
| 4,970,564 | 11/1990 | Kimura et al. | 357/23.6 |

OTHER PUBLICATIONS

Ben G. Streetman, Solid State Electronic Devices 1980, pp. 180.

Primary Examiner—Andrew J. James
Assistant Examiner—T. Davenport
Attorney, Agent, or Firm—Sughrue, Mion, Zinn, Macpeak & Seas

[57] ABSTRACT

A dynamic random access memory cell with a stacked capacitor comprises a switching transistor shifted between on and off states, an inter-level insulating film covering the switching transistor and having a contact window and a storage capacitor provided on the inter-level insulating film and coupled to the switching transistor through the contact window, and the storage capacitor includes a lower electrode having a generally convex top surface and a pug portion penetrating through the contact window so as to electrically connect with the switching transistor, a thin dielectric film covering the generally convex top surface of the lower electrode and an upper electrode formed on the thin dielectric film, since the thin dielectric film extends along the generally convex top surface, a conformal coverage takes place for producing uniform electric field across the thin dielectric film, thereby decreasing undesirable leakage current flowing between the lower and upper electrodes.

10 Claims, 5 Drawing Sheets

DYNAMIC RANDOM ACCESS MEMORY CELL WITH IMPROVED STACKED CAPACITOR

FIELD OF THE INVENTION

This invention relates to a dynamic random access memory device and, more particularly, to the structure of a one-transistor and one-capacitor type dynamic random access memory cell.

DESCRIPTION OF THE RELATED ART

In order to increase the number of memory cells per single semiconductor memory device, the device dimensions must be scaled down or three-dimensionally arranged on the semiconductor substrate. One of the approaches the three-dimensional arrangement results in the structure of a memory cell with a stacked capacitor, and the memory cell with the stacked capacitor is reported in ELECTRONIC PARTS AND MATERIALS, January 1986, page 56 or in NIKKEI ELECTRONICS, Jun. 3, 1985, page 213.

A typical example of the memory cell with the stacked capacitor is fabricated through a process sequence illustrated in FIGS. 1A to 1D. The process sequence starts with preparation of a p-type silicon substrate 1, and a thick field oxide film 2 is grown through a selective oxidation process for defining an active area. A thin gate oxide film 3 is thermally grown on the major surface of the active area, and a polysilicon film is deposited on the entire surface of the structure. A lithographic process is applied to the polysilicon film, and a gate electrode 4 is patterned on the thin gate oxide film 3. Arsenic atoms are ion-implanted into the active area in a self-aligned fashion at dose of $1 \times 10^{16}$ cm$^{-2}$, and the ion accelerator is adjusted to 70 KeV. Then, source and drain regions 5 and 6 are formed in the active area as shown in FIG. 1A.

A polysilicon film is deposited to 2000 angstroms by using a chemical vapor deposition technique, and the polysilicon film serves as an inter-level insulating film 7. A photo-resist solution is spun onto the entire surface of the structure for providing a photo-resist film, and the photo-resist film is patterned so that a mask layer 8 exposes a contact window forming area. The inter-level insulating film 7 and the thin gate oxide film 3 are partially etched away so that a source contact window 9 penetrates onto the source region 5 as shown in FIG. 1B.

The mask layer 8 is stripped off, and a polysilicon film is deposited to about 4000 angstroms. The polysilicon film is brought into contact with the source region 5 through the source contact window 9. A photo-resist solution is spun onto the polysilicon film and is patterned through a lithographic process so that a mask layer 10 is provided on the polysilicon film. The polysilicon film is then partially removed by using a reactive ion etching process, and a lower electrode 11 is formed on the interlevel insulating film 7. As will be seen from FIG. 1C, the lower electrode 11 is in contact with the source region 5, and the peripheral edge 11a of the lower electrode 11 is extremely sharp due to the reactive ion etching. The reactive ion etching is of the anisotropical etching technique, and the anisotropical etching allows the lower electrode 11 to have a large amount of area effectively increasing the capacitance. If an isotropical etching is applied to form the lower electrode 11, the sharp peripheral edge 11a is removed from the lower electrode 11, and only the central area of the lower electrode 11 is opposed to an upper electrode at a narrow spacing.

The mask layer 10 is stripped off, and a thin silicon nitride film is deposited to 200 angstroms by using a chemical vapor deposition technique and is patterned so as to form a thin dielectric film 12. A polysilicon film is deposited on the entire surface of the structure through the chemical vapor deposition process, and a photomask layer 13 is formed on the polysilicon film. The polysilicon film is then etched and patterned by using the photomask layer 13, and an upper electrode 14 is formed on the thin dielectric film 12 as shown in FIG. 1D. The photomask layer 13 is removed from the structure, and the lower electrode 11, the thin dielectric film 12 and the upper electrode 14 form in combination a storage capacitor of the stacked type.

However, a problem is encountered in the prior art memory cell with the stacked capacitor in that leakage current flows between the sharp peripheral edge 11a and the upper electrode 14. This is because of the fact that the maximum electric field strength takes place at the sharp peripheral edge 11a. Moreover, the sharp peripheral edge 11a causes poor step coverage of the thin dielectric a film 12, and the thin dielectric film 12 with the poor step coverage promotes the leakage current. Thus, the sharp peripheral edge 11a is desirable in view of the capacitance as described hereinbefore, but decreases the duration of a data bit memorized therein in the form of electric charges.

SUMMARY OF THE INVENTION

It is therefore an important object of the present invention to provide a dynamic random access memory cell with a stacked capacitor which has a large amount of capacitance but is free from undesirable leakage current.

It is also important object of the present invention to provide a process of fabricating a random access memory cell which has the structure for a large amount of capacitance without leakage current.

To accomplish these objects, the present invention proposes to shape the top surface of a lower electrode of a storage capacitor to a generally convex configuration.

In accordance with one aspect of the present invention, there is provided a dynamic random access memory cell fabricated on a semiconductor substrate, comprising: a) a switching transistor shifted between on and off states; b) an inter-level insulating film covering the switching transistor and having a contact window; and c) a storage capacitor provided on the inter-level insulating film and coupled to the switching transistor through the contact window, the storage capacitor comprising c-1) a lower electrode having a generally convex top surface and a lug portion penetrating through the contact window so as to electrically connect with the switching transistor, c-2) a thin dielectric film covering the generally convex top surface of the lower electrode so that a conformal coverage takes place along the convex top surface, and c-3) an upper electrode formed on the thin dielectric film.

In accordance with another aspect of the present invention there is provided a process of fabricating a dynamic random access memory cell, comprising the steps of: a) preparing a semiconductor substrate; b) forming a switching transistor partially in the semiconductor substrate and partially on the semiconductor substrate; c) covering the switching transistor with an inter-level insulating film; d) forming a contact window in the interlevel insulating film; e) selectively growing a conductive material on the inter-level insulating film, the conductive material being brought into contact with the switching transistor through the contact window, the conductive material having a generally convex top surface for providing a lower electrode of a storage capacitor; f) forming a thin dielectric film on the generally convex top surface so that a conformal coverage takes place along the generally convex top surface; and g) forming an upper electrode of the storage capacitor on the thin dielectric film.

BRIEF DESCRIPTION OF THE DRAWINGS

The features and advantages of a random access memory cell with a stacked capacitor and a process of fabrication thereof according to the present invention will be more clearly understood from the following description taken in conjunction with the accompanying drawings in which.

DESCRIPTION OF THE PREFERRED EMBODIMENTS

Process Sequence

Figure 1A:
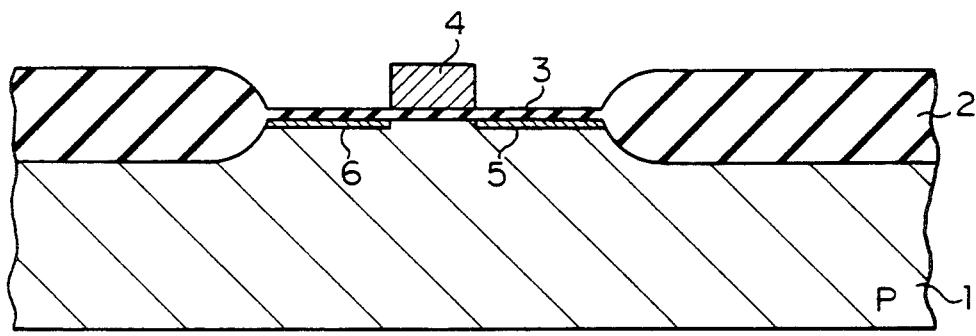
FIGS. 1A to 1D are cross sectional views showing a prior art process sequence for fabricating the prior art dynamic random access memory cell with the stacked capacitor.
Figure 1B:
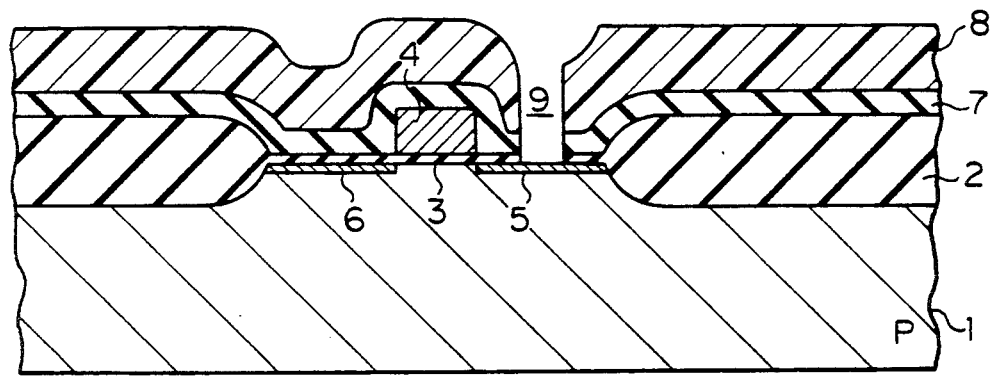
Figure 1C:
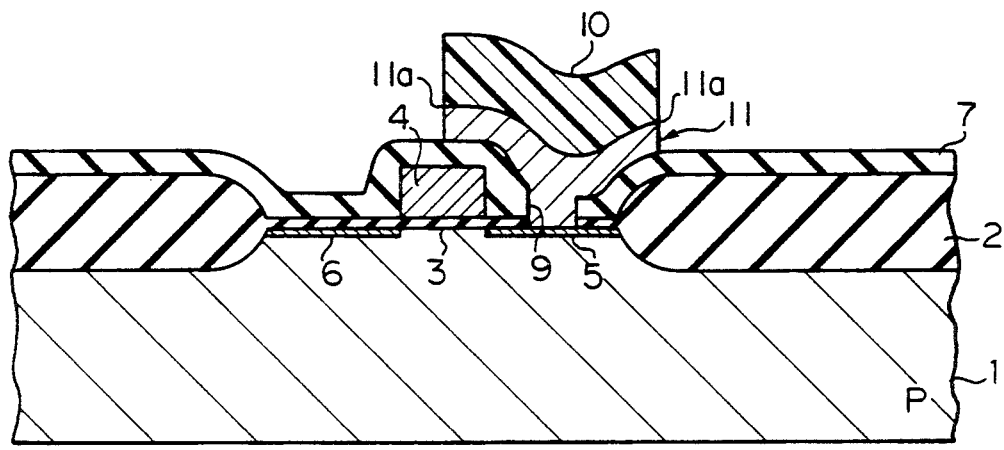
Figure 1D:
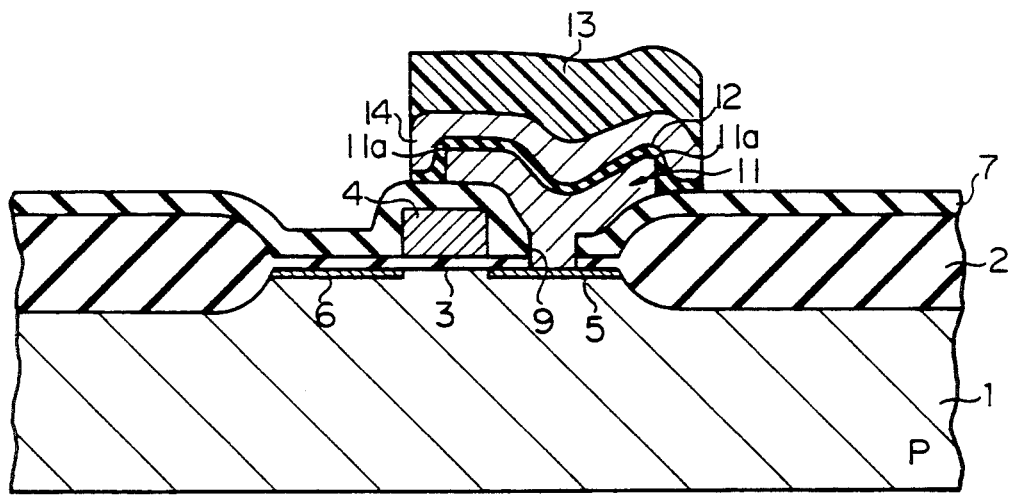
Figure 2A:
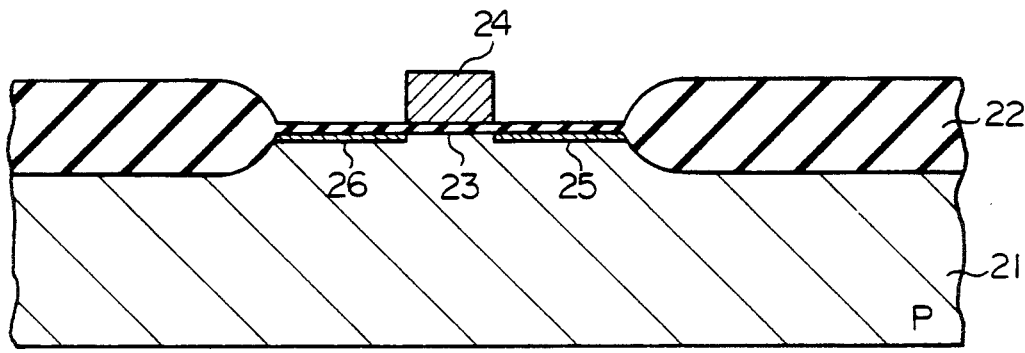
FIGS. 2A to 2D are cross sectional views showing a process sequence according to the present invention.

Referring to FIGS. 2A to 2D, a process of fabricating a dynamic random access memory cell starts with preparation of a p-type single crystal silicon substrate 21 with the orientation of (100). A thick field oxide film 22 is grown through a selective oxidation process for defining an active area, and a thin gate oxide film 23 is thermally grown on the major surface of the active area. A polysilicon film is deposited on the entire surface of the structure by using a chemical vapor deposition by way of example. A lithographic process is applied to the polysilicon film, and a gate electrode 24 is patterned on the thin gate oxide film 23. With the gate electrode 24 serving as a mask layer, arsenic atoms are ion-implanted into the active area at dose of about $1 \times 10^{16}$ cm$^{-2}$, and the ion accelerator is adjusted to about 70 KeV. Then, source and drain regions 25 and 26 are formed in the active area in a selfaligned manner with the gate electrode 24 The resultant structure of this stage is shown in FIG. 2A.

Figure 2B:
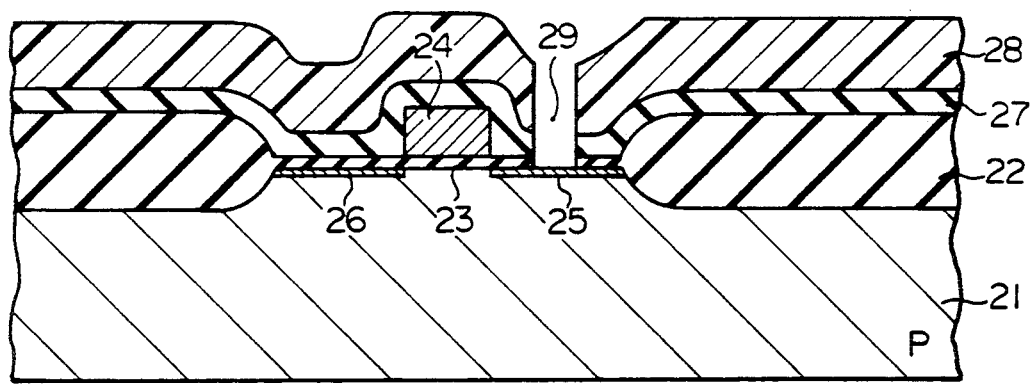

A polysilicon film is deposited to about 2000 angstroms by using the chemical vapor deposition technique, and the polysilicon film serves as an inter-level insulating film 27. A photo-resist solution is spun onto the entire surface of the structure for providing a photo-resist film, and the photo-resist film is patterned so that a mask layer 28 exposes a contact window forming area. The inter-level insulating film 27 and the thin gate oxide film 23 are partially etched away so that a source contact window 29 penetrates onto the source region 25. The resultant structure of this stage is shown in FIG. 2B.

Figure 2C:
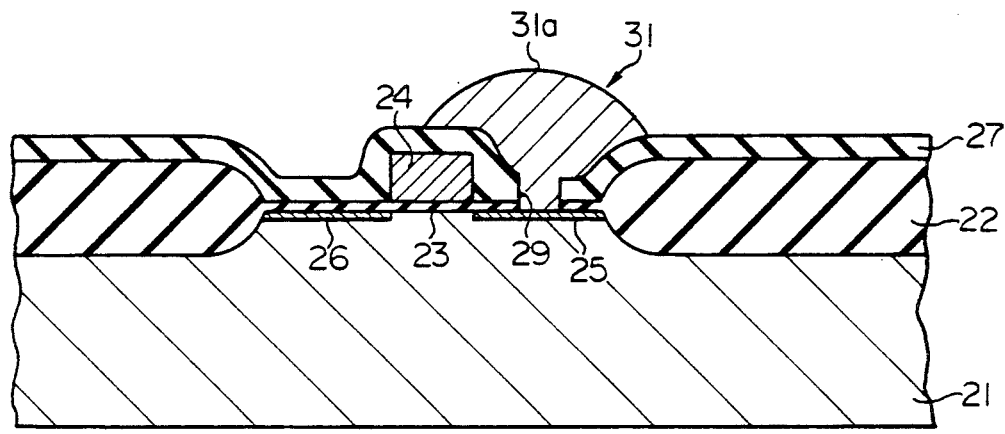

After the formation of the contact window 29, the mask layer 28 is stripped off, and a fine single crystal silicon film is grown to about 4000 angstroms by using an epitaxial lateral overgrowth. Namely, the fine silicon film thus deposited is projected from the source region 25 through the source contact window 29, and the exposed single-crystal silicon substrate 21 or the source region 25 serves as a seed area for the epitaxial growth of the fine single crystal silicon film, and the top surface of the single crystal silicon film is formed into a convex configuration as shown in FIG. 2C because of the selective epitaxial growth. The epitaxial lateral overgrowth is carried out under the conditions, i.e. at a growth temperature of about 900 degrees centigrade, in an environment of reduced gas pressure with about 25 torr, at a flow rate of SiH$_2$Cl$_2$ of 0.33 litter per minute, a flow rate of HCl of 0.6 litter per minute and a flow rate of H$_2$ of 77 litters per minute.

Thus, the lower electrode 31 is formed on the interlevel insulating film 27, and phosphorus atoms are ion-implanted into the lower electrode 31 at dose of about $5.0 \times 10^{15}$ cm$^{-2}$ with an ion acceleration of about 100 KeV. The resultant structure of this stage is shown in FIG. 2C. The epitaxial growth of the single crystal silicon is further advantageous over the prior art formation stage for the lower electrode, because no lithographic process and, accordingly, no photo mask is required. This is conducive to reducing production costs.

Figure 2D:
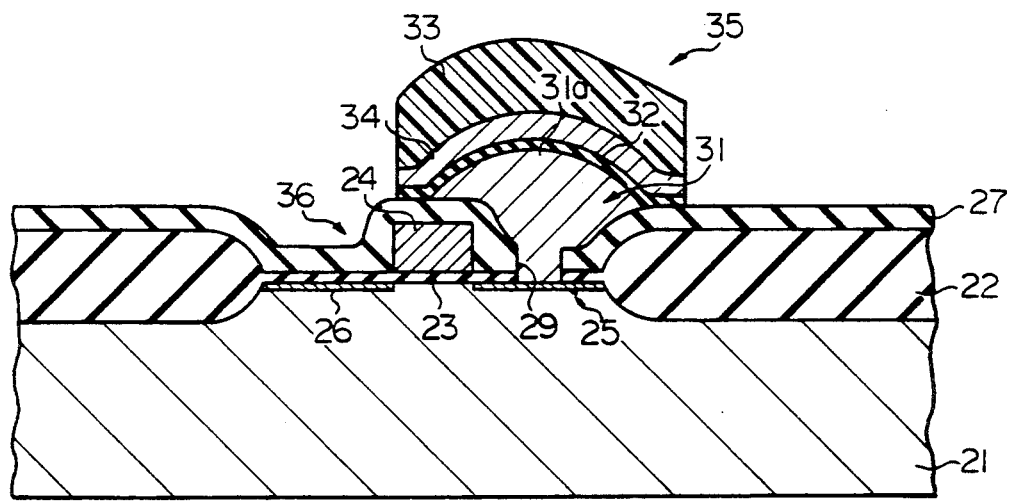

After the formation of the lower electrode 31, a thin silicon nitride film is deposited to about 200 angstroms by using a chemical vapor deposition technique, and is etched and patterned so as to form a thin dielectric film 32. A doped polysilicon film is, by way of example, deposited to about 3000 angtroms on the entire surface of the structure, and a photo-mask layer 33 is formed on the polysiicon film. The polysilicon film is then etched and patterned by using a reactive ion etching technique, and an upper electrode 34 is formed on the thin dielectric film 32 as shown in FIG. 2D. Since the thin dielectric film 32 is conformal to the generally convex top surface 31a of the lower electrode 31, the thin dielectric film 32 is also curved along the generally convex top surface 31a and, accordingly, allows the upper electrode 34 to be spaced from the lower electrode 31 by a constant distance. The top surface 31a thus is smoothly curved without sharp edges results in a completely conformal coverage of the thin dielectric film 32. A uniform electric field takes place between the lower and upper electrodes 31 and 34 along the top surface 31a. The uniform electric field and the conformal coverage effectively reduce the leakage current across the thin dielectric film 32, and, accordingly, the duration of a data bit memorized therein is prolonged. The conformal coverage is conducive to reduction of serious damage in the thin dielectric film 32, and, for this reason, the production yield is further improved.

The photo-mask layer 33 is removed from the structure, and the lower electrode 31, the thin dielectric film 32 and the upper electrode 34 form in combination a storage capacitor 35 of the stacked type. On the other hand, the source and drain regions 25 and 26, the thin gate oxide film 23 and the gate electrode 24 as a whole constitute a switching transistor 36, and the storage capacitor 35 and the switching transistor 36 electrically connected to each other provide a dynamic type random access memory according to the present invention.

In the first embodiment, a single crystal epitaxial silicon is selectively grown for providing the lower electrode, however, if the growing temperature is much lowered than 900 degrees in centigrade, a polycrystal silicon is grown instead of the single crystal silicon, and the low temperature growth is desirable because impurity profiles are less liable to be deformed.

Second Embodiment

Figure 3A:
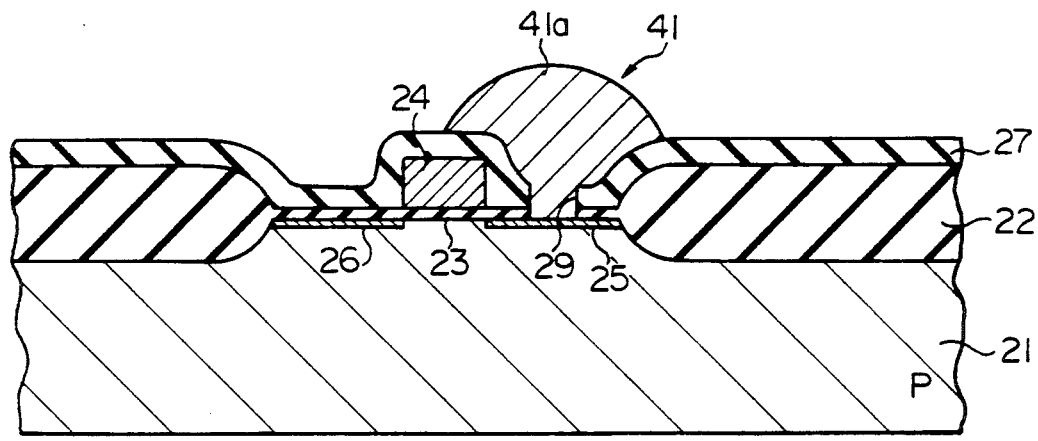
FIGS. 3A and 3B are cross sectional views showing an essential part of another process sequence according to the present invention.
Figure 3B:
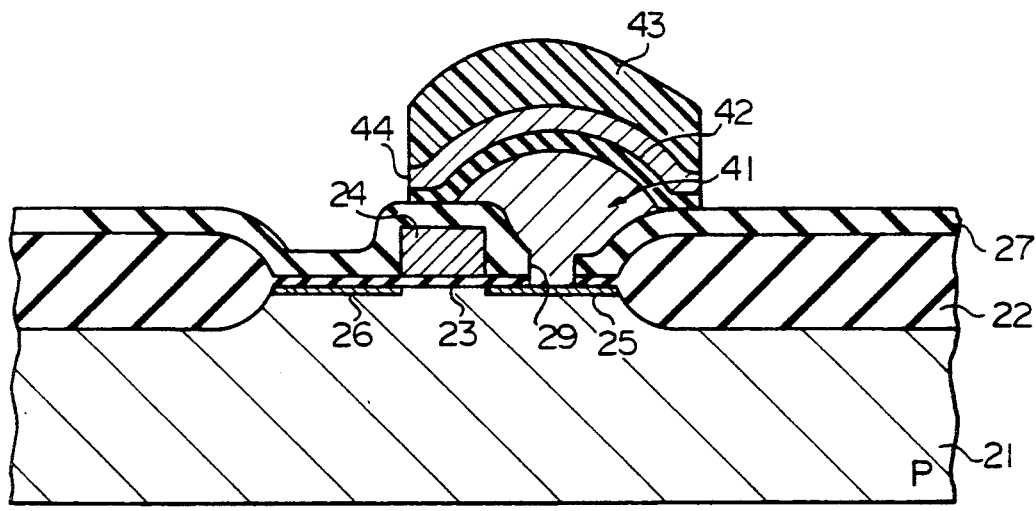

Turning to FIGS. 3A and 3B of the drawings, an essential part of another process sequence according to the present invention is illustrated. The steps described with reference to FIGS. 2A to 2B are repeated for an intermediate structure, and, for this reason, no detailed description is incorporated hereinbelow. Films and regions forming parts of the intermediate structure shown in FIG. 3A are designated by the same reference numerals used in FIG. 2B.

After the formation of the contact window 29, tungsten is selectively grown on the exposed source region 25 for providing a lower electrode 41, and the top surface 41a of the lower electrode 41 is shaped into a generally convex configuration. The selective tungsten growth is carried in a gaseous mixture with a gas composition of $H_2/WF_6SiH_4=30:1:1$ at a flow rate of $WF_6$ of about 5 sccm. The total pressure for the selective growth is 20 milli-torr and the growth temperature is about 280 degrees in centigrade. The resultant structure of this stage is shown in FIG. 3A. By virtue of the selective growth of tungsten, the lower electrode 41 has a generally convex surface, and the generally convex surface characterizes this instance.

After the formation of the lower electrode 41, a thin silicon nitride film is deposited to about 200 angstroms by using a chemical vapor deposition technique, and is etched and patterned so as to form a thin dielectric film 42. A polysilicon film is deposited to about 3000 angstroms on the entire surface of the structure, and a photo-mask layer 43 is formed on the polysilicon film. The polysilicon film is then etched and patterned by using a reactive ion etching technique, and an upper electrode 44 is formed on the thin dielectric film 42 as shown in FIG. 3B. The thin dielectric film 42 is also conformal to the generally convex top surface 41a of the lower electrode 41, and, accordingly, allows the upper electrode 44 to be spaced from the lower electrode 41 by a constant distance. The completely conformal coverage of the thin dielectric film 42 is conducive to producing uniform electric field, and a negligible amount of leakage current merely flows across the thin dielectric film 42.

Although particular embodiments of the present invention have been shown and described, it will be obvious to those skilled in the art that various changes and modifications may be made without departing from the spirit and scope of the present invention.

For example, the thin dielectric film of the storage capacitor may be formed of a silicon oxide, a high-permittivity film such as, for example, a tantalum oxide ($Ta_2O_5$) or any combination of those films.

What is claimed is:

1. A semiconductor device comprising:
   a semiconductor substrate having an element forming region selectively formed therein;
   an insulating film covering said semiconductor substrate, a contact hole being formed in said insulating film for exposing a part of said element forming region;
   a lower electrode having a smooth convex top surface and filling said contact hole so as to be held in contact with said part of said element forming region in an ohmic manner, said smooth convex top surface terminating on a substantially flat surface of said insulating film;
   a dielectric film covering said smooth convex top surface and extending on said substantially flat surface; and
   an upper electrode formed on a surface of said dielectric film.

2. A semiconductor device as set forth in claim 1, in which said semiconductor device further comprises a switching transistor electrically coupled with said lower electrode and comprising source and drain regions formed in a surface portion of said semiconductor substrate, a gate insulating film covering at least the surface portion between the source and drain regions and a gate electrode formed on said gate insulating film.

3. The semiconductor device as set forth in claim 1, in which said lower electrode is formed of a doped silicon.

4. The semiconductor device as set forth in claim 3, in which said thin dielectric film is formed of a substance selected from the group consisting of a silicon nitride, a silicon oxide and a tantalum oxide.

5. The semiconductor device as set forth in claim 4, in which said upper electrode is formed of a doped polysilicon.

6. The semiconductor device as set forth in claim 3, in which said doped silicon is of a single crystal epitaxial silicon.

7. The semiconductor device as set forth in claim 3, in which said doped silicon is of a polysilicon.

8. The semiconductor device as set forth in claim 1, in which said lower electrode is formed of tungsten.

9. The semiconductor device as set forth in claim 8, in which said thin dielectric film is formed of a substance selected from the group consisting of a silicon nitride, a silicon oxide and a tantalum oxide.

10. A semiconductor device comprising:
    a semiconductor substrate having an element forming region selectively formed therein;
    an insulating film covering said semiconductor substrate, a contact hole being formed in said insulating film for exposing a part of said element forming region;
    a silicon electrode grown on said part of said element forming region serving as a seed of growth for filling said contact hole and having a smooth convex top surface, said smooth convex top surface terminating on a substantially flat surface of said insulating film;
    a dielectric film covering said smooth convex top surface and extending on said substantially flat surface; and
    an upper electrode formed on a surface of said dielectric film.

* * * * *